US012269116B2

(12) United States Patent
Lavoute et al.

(10) Patent No.: US 12,269,116 B2
(45) Date of Patent: Apr. 8, 2025

(54) LASER TREATMENT SYSTEM AND METHOD

(71) Applicants: Aledia, Echirolles (FR); Leukos, Limoges (FR)

(72) Inventors: Laure Lavoute, Isle (FR); Dmitriy Gaponov, Limoges (FR); Marc Castaing, Isle (FR); Nicolas Ducros, Bosmie l'aiguille (FR); Olivier Jeannin, Grenoble (FR)

(73) Assignees: Aledia, Champagnier (FR); Leukos, Limoges (FR)

( * ) Notice: Subject to any disclaimer, the term of this patent is extended or adjusted under 35 U.S.C. 154(b) by 410 days.

(21) Appl. No.: 17/630,876

(22) PCT Filed: Jul. 21, 2020

(86) PCT No.: PCT/EP2020/070502
§ 371 (c)(1),
(2) Date: Jan. 27, 2022

(87) PCT Pub. No.: WO2021/018661
PCT Pub. Date: Feb. 4, 2021

(65) Prior Publication Data
US 2022/0266384 A1    Aug. 25, 2022

(30) Foreign Application Priority Data
Jul. 31, 2019  (FR) ...................................... 1908743

(51) Int. Cl.
B23K 26/06     (2014.01)
B23K 26/0622  (2014.01)
(Continued)

(52) U.S. Cl.
CPC ...... *B23K 26/0648* (2013.01); *B23K 26/0622* (2015.10); *G02B 3/04* (2013.01); *B23K 2101/40* (2018.08)

(58) Field of Classification Search
CPC ............ B23K 26/0648; B23K 26/0622; B23K 26/57; B23K 2101/40; B23K 2103/56; G02B 3/04; H01L 21/6835
See application file for complete search history.

(56) References Cited

U.S. PATENT DOCUMENTS 5,265,114 A      11/1993  Sun et al.
2012/0285937 A1 11/2012 Birnbaum et al.
(Continued)

FOREIGN PATENT DOCUMENTS

EP    1 804 280 A1   7/2007
IT    TO20110327 A1  10/2012

OTHER PUBLICATIONS

International Search Report and Written Opinion for International Application No. PCT/EP2020/070502, mailed Aug. 27, 2020.

*Primary Examiner* — Michael Lebentritt
(74) *Attorney, Agent, or Firm* — Wolf, Greenfield & Sacks, P.C.

(57) ABSTRACT

A system for the treatment of a region of an object adjacent to a substrate. The system includes a source of an incident laser beam delivering a focused laser beam. The wavelength of the incident laser beam is greater than the sum of 500 nm and of the wavelength associated with the bandgap of the material forming the substrate and smaller than the sum of 2,500 nm and of this wavelength. The system includes an optical device associating a digital aperture greater than 0.3 and means for correcting the spherical aberrations appearing during the crossing of the substrate for a given thickness of the substrate and a given distance between the substrate and the optical device. The processing being performed on the (Continued)

region through the substrate, and including the physical, chemical, or physico-chemical modification or the ablation of said region.

13 Claims, 3 Drawing Sheets

(51) Int. Cl.
 *B23K 101/40* (2006.01)
 *G02B 3/04* (2006.01)

(56) References Cited

U.S. PATENT DOCUMENTS

2016/0089749 A1 3/2016 Mori
2017/0125268 A1* 5/2017 Dang ................ H01L 21/67132

* cited by examiner

LASER TREATMENT SYSTEM AND METHOD

This application is a national stage filing under 35 U.S.C. § 371 of International Patent Application Serial No. PCT/EP2020/070502, filed Jul. 21, 2020, which claims priority to French patent application FR19/08743, filed Jul. 31, 2019. The contents of these applications are incorporated herein by reference in their entirety.

TECHNICAL BACKGROUND

The present disclosure generally concerns systems and methods of laser treatment of an object comprising a semiconductor substrate.

PRIOR ART

For certain applications, it is desirable to be able to perform a laser treatment of an object comprising a semiconductor substrate, for example, made of silicon, through the substrate. Document US 2019/0058085 describes an example of such an application where light-emitting diodes formed from a seed layer covering a silicon substrate are detached from the substrate by the ablation of the seed layer by means of an infrared laser through the substrate.

A disadvantage is that silicon substantially does not transmit electromagnetic radiations having a wavelength smaller than 1,100 nm, which prevents the use of the infrared lasers most commonly available for sale. Further, even by using a laser at a wavelength for which silicon is substantially transparent, it may be difficult to efficiently focus the laser beam onto the region to be removed, particularly due to non-linear interactions between the laser and the silicon. It may further be difficult to prevent the deterioration of the regions next to the region to be treated.

SUMMARY

Thus, an object of an embodiment is to at least partly overcome the disadvantages of the previously-described systems and method of laser treatment of an object comprising a semiconductor substrate.

An object of an embodiment is for the laser beam to be focused onto the region to be treated through the semiconductor substrate.

Another object of an embodiment is for the regions of the object next to the region to be treated not to be damaged by the treatment.

An embodiment provides a system configured for the treatment of a region of an object adjacent to a substrate, the system comprising:
  a source of an incident laser beam configured to deliver a focused laser beam, said configuration being such that the wavelength of the incident laser beam is greater than the sum of 500 nm and of the wavelength associated with the bandgap of the material forming the substrate and smaller than the sum of 2,500 nm and of the wavelength associated with the bandgap of the material forming the substrate; and
  an optical device associating a digital aperture greater than 0.3 and means for correcting the spherical aberrations occurring during the crossing of the substrate for a given thickness of the substrate and a given distance between the substrate and the optical device, said treatment being performed on said region adjacent to the substrate and opposite to the optical device, that is, through said substrate, and comprising the physical, chemical, or physico-chemical modification or the ablation of said region.

According to an embodiment, the material forming the substrate is semiconductor.

According to an embodiment, the source is adapted to delivering at least one pulse of the incident laser beam, the duration of said at least one pulse being in the range from 0.1 ps to 1,000 ps.

According to an embodiment, the source is adapted to delivering said at least one pulse of the incident laser beam with a peak power in the range from 300 kW to 100 MW.

According to an embodiment, the optical device comprises at least one aspherical lens.

An embodiment also provides a method of treatment of a region of an object further comprising a substrate adjacent to the region to be treated comprising exposing the region to be treated to the focused laser beam delivered by the system such as previously defined through the substrate.

According to an embodiment, the substrate is semiconductor.

According to an embodiment, the method comprises the delivery of at least one pulse of the incident laser beam, the duration of said at least one pulse being in the range from 0.1 ps to 1,000 ps.

According to an embodiment, the method comprises the delivery of said at least one pulse with a peak power in the range from 300 kW to 100 MW.

According to an embodiment, the substrate comprises a surface oriented towards the system, the method comprising the forming of an antireflection layer on said surface.

According to an embodiment, the substrate is made of silicon, of germanium, or of a mixture or an alloy of at least two of these compounds.

According to an embodiment, the object comprises a dielectric layer covering the substrate, the region to be treated being interposed between the substrate and the dielectric layer.

According to an embodiment, the object comprises at least one electronic circuit covering the substrate, the region to be treated being interposed between the substrate and the electronic circuit.

According to an embodiment, the method comprises the destruction of the region of interest by the focused laser beam.

BRIEF DESCRIPTION OF THE DRAWINGS

The foregoing features and advantages, as well as others, will be described in detail in the following description of specific embodiments given by way of illustration and not limitation with reference to the accompanying drawings, in which.

1 according to the distance of the laser beam with respect to the focal plane of the optical device of the treatment system.

DESCRIPTION OF THE EMBODIMENTS

Like features have been designated by like references in the various figures. In particular, the structural and/or functional features that are common among the various embodiments may have the same references and may dispose identical structural, dimensional and material properties. For the sake of clarity, only the steps and elements that are useful for an understanding of the embodiments described herein have been illustrated and described in detail. In particular, the laser sources are well known by those skilled in the art and are not detailed hereafter.

In the following description, when reference is made to terms qualifying absolute positions, such as terms "front", "rear", "top", "bottom", "left", "right", etc., or relative positions, such as terms "above", "under", "upper", "lower", etc., it is referred, unless otherwise mentioned, to the orientation of the drawings or to a . . . in a normal position of use. Unless specified otherwise, the expressions "around", "approximately", "substantially" and "in the order of" signify within 10%, and preferably within 5%.

Figure 1:
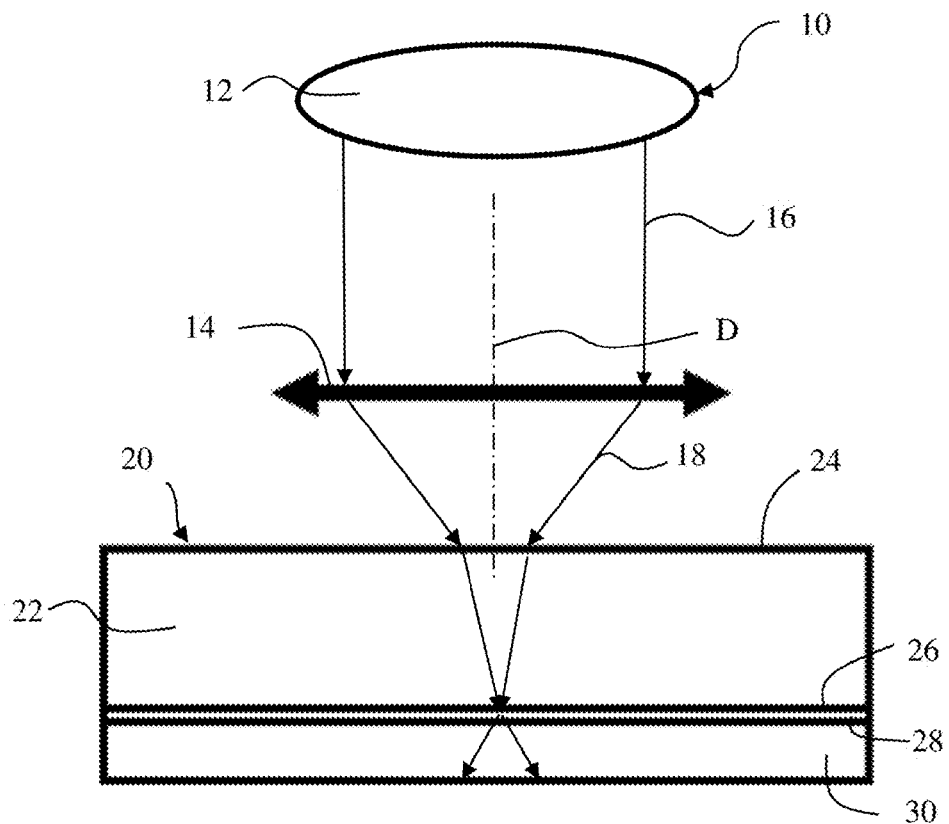
FIG. 1 illustrates an embodiment of a system of laser treatment of an object.

FIG. 1 is a partial simplified cross-section view of an embodiment of a system 10 for treating an object 20.

Treatment system 10 comprises a laser source 12 and an optical focusing device 14 having an optical axis D. Source 12 is adapted to delivering an incident laser beam 16 to collimation device 14, which delivers a converging laser beam 18. Optical focusing device 14 may comprise one optical component, two optical components, or more than two optical components, an optical component for example corresponding to a lens. Preferably, incident laser beam 16 is substantially collimated along the optical axis D of optical device 14.

Object 20 comprises a substrate 22 made of a semiconductor material. The semiconductor material may be silicon, germanium, or a mixture of at least two of these compounds. Preferably, substrate 22 is made of silicon, more preferably of single-crystal silicon. Semiconductor substrate 22 comprises two opposite surfaces 24, 26, laser beam 18 penetrating into substrate 22 from surface 24. According to an embodiment, surfaces 24 and 26 are parallel. According to an embodiment, surfaces 24 and 26 are planar. According to an embodiment, the thickness of substrate 22 is in the range from 50 µm to 3 mm. According to an embodiment, an antireflection layer, not shown, is provided on the front surface 24 of substrate 22. As a variant, substrate 22 may be, at least partly, made of a non-semiconductor material, for example, an electrically-insulating material or an electrically-conductive material.

Object 20 comprises a region to be treated 28 at the level of second surface 26 and which is the region 28 to be treated. According to another embodiment, substrate 22 is not covered with another element on the side of surface 26 and the region 28 to be treated corresponds to surface 26 of substrate 22. In the present embodiment illustrated in FIG. 1, the region 28 to be treated corresponds to a layer covering surface 26. The layer 28 to be treated may be made of a different material than substrate 22. As a variant, the layer 28 to be treated may be made of the same material as substrate 22 and then correspond to a portion of substrate 22.

In FIG. 1, an additional area 30 covering the layer 28 to be treated on the side of the layer 28 to be treated opposite to substrate 22 has further been shown. As an example, element 30 may comprise a layer made of a different material than substrate 22 and than the layer 28 to be treated. As a variant, layer 30 may be made of the same material as substrate 22 or of the same material as the layer 28 to be treated. According to an embodiment, layer 30 is made of a dielectric material, for example, made of silicon oxide or of silicon nitride. Element 30 may further comprise electronic circuits, for example, circuits with light-emitting diodes or circuits with transistors, for example, MOS transistors.

According to an embodiment, the treatment corresponds to the ablation of the layer 28 to be treated to allow the detaching of element 30 from substrate 22. According to another embodiment, particularly when the region 28 to be treated corresponds to surface 26 of substrate 22, the treatment corresponds to the texturing of surface 26. According to another embodiment, the treatment corresponds to an energy input in the region 28 to be treated, for example, to cause a chemical reaction or a physical phenomenon.

According to an embodiment, the wavelength of the laser beam 18 delivered by treatment system 10 is greater than the wavelength corresponding to the bandgap of the material forming substrate 22, preferably by at last 500 nm, more preferably by at least 700 nm. This advantageously enables to decrease the interactions between laser beam 18 and substrate 22 during the crossing of substrate 22 by laser beam 18. According to an embodiment, the wavelength of the laser beam 18 delivered by treatment system 10 is not greater than the wavelength corresponding to the bandgap of the material forming substrate 22, preferably by more than 2,500 nm. This advantageously enables to more easily provide a laser beam forming a laser spot of small dimensions.

In the case where substrate 22 is made of silicon which has a 1.14-eV bandgap, which corresponds to a 1.1-µm wavelength, the wavelength of laser beam 18 is selected to be equal to approximately 2 µm. A source 20 delivering a laser beam is for example commercialized by Novae under trade name BrevityHP. In the case where substrate 22 is made of germanium which has a 0.661-eV bandgap, which corresponds to a 1.87-µm wavelength, the wavelength of laser beam 18 is selected to be equal to approximately 2 µm or 2.35 µm.

According to an embodiment, laser beam 18 is polarized. According to an embodiment, laser beam 18 is polarized according to a rectilinear polarization. This advantageously enables to improve the interactions of laser beam 28 with the region 28 to be treated. According to another embodiment, laser beam 18 is polarized according to a circular polarization. This advantageously enables to favor the propagation of laser beam 18 in substrate 22.

According to an embodiment, laser beam 18 is emitted by treatment system 10 in the form of a pulse, of two pulses, or of more than two pulses, each pulse having a duration in the range from 0.1 ps to 1,000 ps. The peak power of the laser beam for each pulse is in the range from 300 kW to 100 MW. The fact of using pulses longer than pulses having a duration shorter than 100 femtoseconds enables to decrease the peak power of laser beam 18 and thus to decrease the non-linear interactions of laser beam 18 with substrate 22. The fact of using pulses shorter than nanosecond pulses enables to avoid an unwanted heating outside of the region 28 to be treated likely to cause a deterioration of the layers next to the region 28 to be treated.

According to an embodiment, the image digital aperture of optical device 14 is greater than 0.2, preferably greater than 0.6, more preferably greater than 0.7. The image digital aperture is equal to product $n_0 \sin(i_0)$ where $n_0$ is the refraction index at the wavelength of the medium crossed by the laser beam at the output of optical device 14, for example, air, and $i_0$ is the angle between the optical axis D of optical device 14 and the radius of the laser beam 18 which comes out of optical device 14 most distant from optical axis D.

According to an embodiment, optical device 14 compensates for the optical aberrations due to the crossing of substrate 22 by laser beam 18. In particular, optical device 14 compensates for the spherical aberrations due to the crossing of substrate 22 by laser beam 18. In the case where laser beam 18 has a normal incidence with respect to optical device 14, the optical aberrations, apart from misfocusing, due to the crossing of substrate 22 by laser beam 18 only correspond to spherical aberrations. In the case where laser beam 18 has a normal incidence relative to optical device 14, optical aberrations, apart from misfocusing, due to the crossing of substrate 22 by laser beam 18 correspond to spherical aberrations and to other aberrations, particularly coma or astigmatism.

Figure 2:
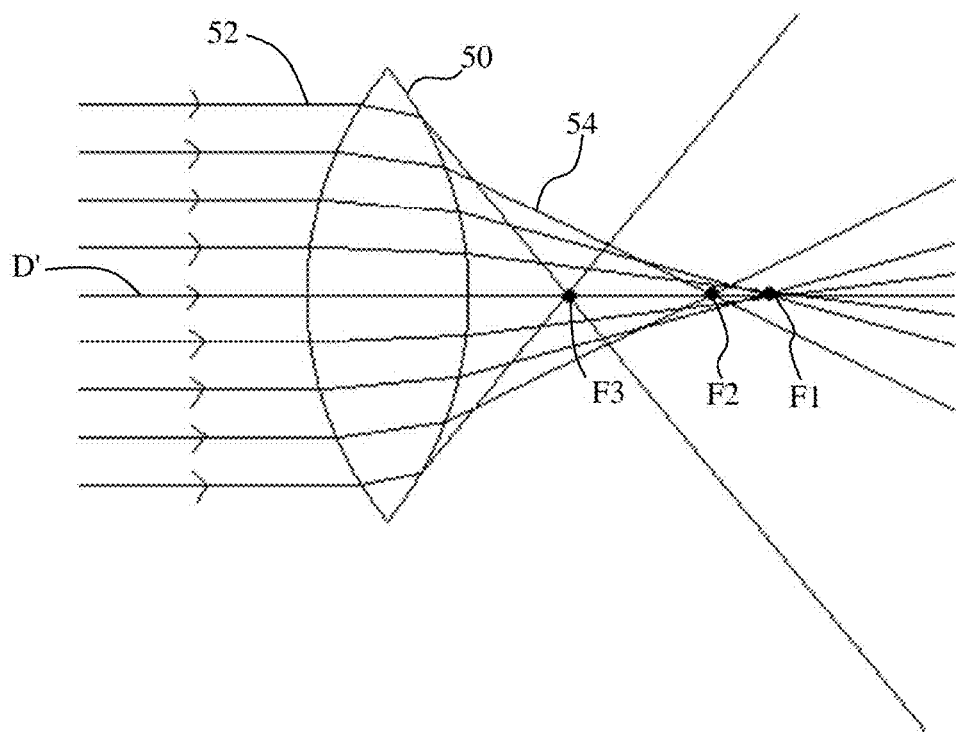
FIG. 2 shows a converging lens exhibiting spherical aberrations.

FIG. 2 illustrates the principle of spherical aberrations and is a partial simplified cross-section view of a lens 50 receiving a light beam 52 having rays parallel to the optical axis D' of lens 50 and delivering a convergent light beam 54. As shown in this drawing, the incident light rays 52 do not converge at the same focal point. In particular, the more the incident light rays are spaced apart from the optical axis D' of lens 50, the more the focal points of these rays are close to lens 50. For light rays close to the optical axis D' of lens 50, the focal points are close and can be considered as forming a single focal point F1. However, this approximation is no longer valid when the interval between the incident light rays and the optical axis D' of lens 50 becomes too large, typically greater than 15 degrees. As an example, two focal points F2 and F3 closer to lens 50 than focal point F1 are shown in FIG. 2.

Optical device 14 is determined to be aspherical in the presence of substrate 22, for a given thickness of substrate 22 and for a given distance between substrate 22 and optical device 14. When optical device 14 comprises a plurality of optical components, for example, a plurality of lenses, the curvature of each input surface and of each output surface of each optical component is determined so that all the light rays of the delivered beam 18 substantially focus at a single focal point F in the region of interest. These curvatures can be determined by digital simulation.

Figure 3:
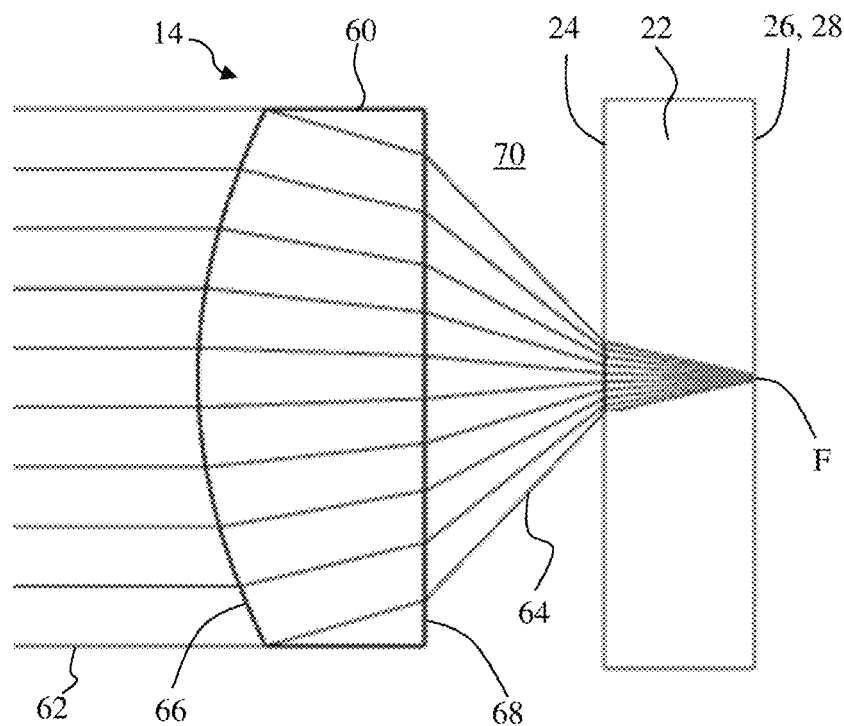
FIG. 3 is a partial simplified cross-section view of an embodiment of the optical device of the treatment system shown in FIG. 1.

FIG. 3 shows an embodiment of optical device 14 where optical device 14 comprises an aspherical lens 60 receiving an incident beam 62, having rays parallel to the optical axis of lens 60 and delivering a convergent light beam 64. Lens 60 comprises an input surface 66 and an output surface 68. In the present embodiment, output surface 68 is planar and input surface 66 is curved. The curvature of input surface 66 is determined so that all the light rays of incident light beam 62 converge at a same focal point F. The determination of the curvature of input surface 66 is performed by taking into account the fact that converging beam 64 successively crosses an air zone 70, where a more or less significant vacuum may be formed or where a controlled gas atmosphere, for example, a nitrogen atmosphere, may be provided, and substrate 22. As an example, in FIG. 3, focal point F is fixed to surface 26 of substrate 22, which corresponds to the region 28 to be treated. As a variant, focal point F may be fixed to the middle of the layer 28 to be treated when the latter is present. Thereby, the curvature of input surface 66 enabling to suppress the spherical aberration is determined for a given thickness of substrate 22 and a given relative position between substrate 22 and optical device 14. According to an embodiment, the distance between the surface 68 of optical device 15 and the surface 24 of substrate 22 is in the range from 0.5 mm to 20 cm.

The use of a large digital aperture of optical device 14 enables to ensure that the energy density of the laser beam is high only at the level of the focal point. The portion of substrate 22 crossed by laser beam 18 and where the energy density of the laser beam is high is thus decreased. This further advantageously enables to limit non-linear interactions of laser beam 18 with substrate 22 outside of the region 28 to be treated. Indeed, non-linear interactions of laser beam 18 with substrate 22 are all the greater as the local energy density of laser beam 18 is high.

The use of an aspherical optical device 14 enables to obtain a proper focusing of laser beam 18 despite the large digital aperture of optical device 14. This enables to decrease the power of the incident laser beam 16 since a significant local energy density may be obtained at the focal point. Further, the obtaining of a decreased focal area enables to ensure that the desired treatment is only performed in the region 28 to be treated and not in the regions next to the region 28 to be treated.

During the treatment, laser beam 18 may cause the forming of a plasma in the region 28 to be treated. The forming of a plasma causes a significant increase in the local absorption of the laser beam in the region of interest.

Figure 4:
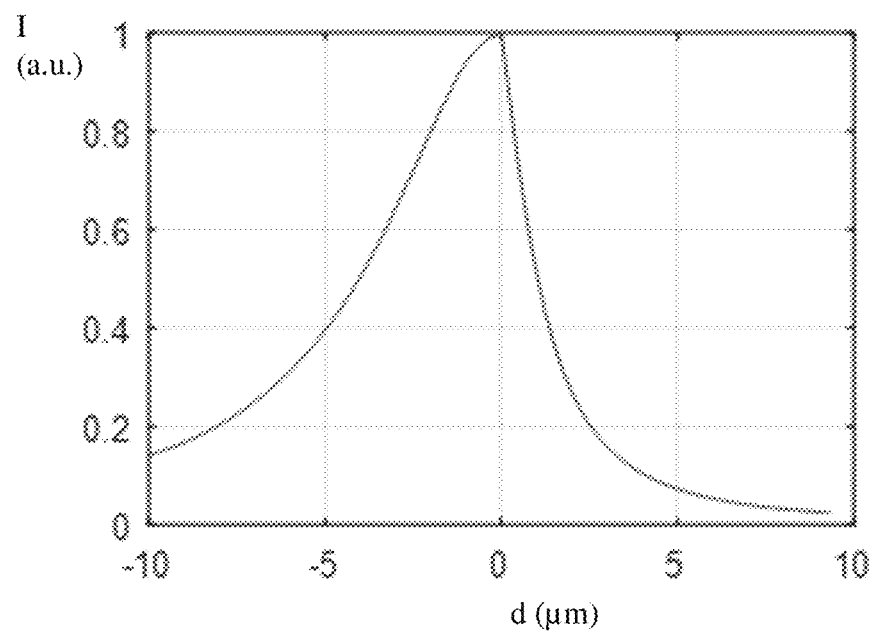
FIG. 4 shows a curve of variation of the irradiance of the laser beam delivered by the treatment system shown in FIG. 1 according to the distance of the laser beam with respect to the focal plane of the optical device of the treatment system.
Figure 5:
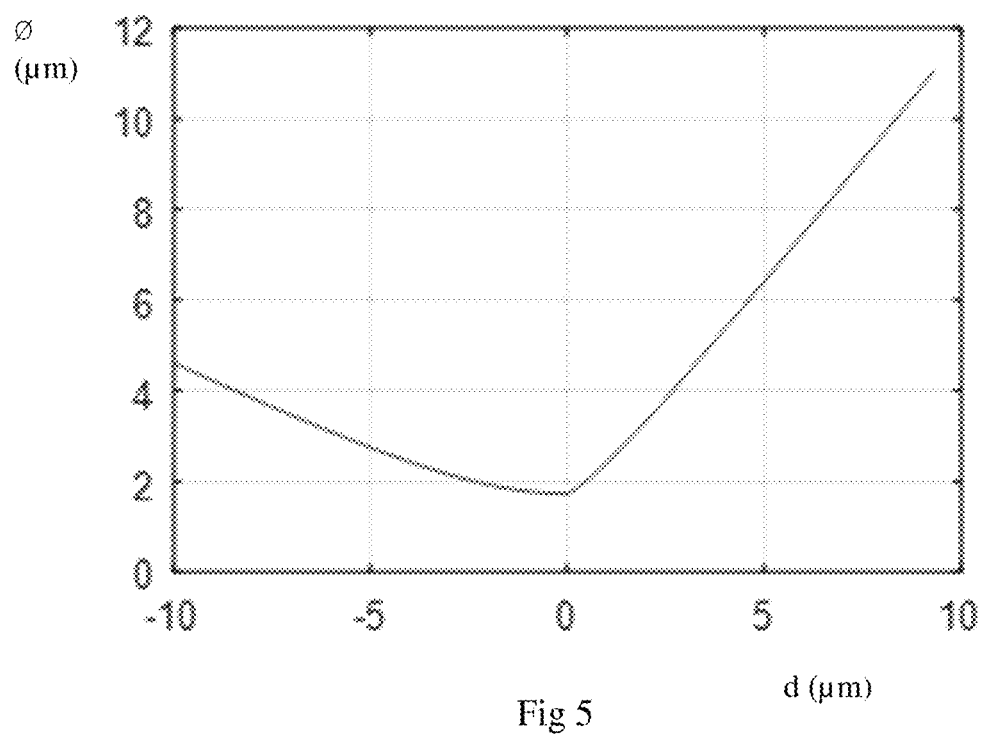
FIG. 5 shows a curve of variation of the diameter of the laser beam delivered by the treatment system shown in FIG.

FIG. 4 shows a curve of variation of the illumination I of the laser beam, expressed in arbitrary units (a.u.) and measured in a plane parallel to the focal plane, according to the distance d of the measurement plane with respect to the focal plane, and FIG. 5 shows a curve of variation of the diameter Ø of the laser beam, measured in a plane parallel to the focal plane, according to the distance d of the measurement plane with respect to the focal plane. The curves shown in FIGS. 5 and 6 have been obtained by simulation by using an aspherical optical device 14 having a digital aperture equal to 0.72. For the simulations, object 20 comprised a silicon substrate 22, which corresponds to negative distances d in FIGS. 4 and 5, and a silicon dioxide layer 30, which corresponds to positive distances d in FIGS. 4 and 5. The focal plane thus corresponds to a distance d equal to zero.

As shown in FIG. 5, the diameter of laser beam 18 in the focal plane is smaller than 2 µm, due to the diffraction, and when the distance from the focal plane in silicon oxide layer 30 increases by 5 µm, the diameter of the laser beam is 6.5 µm. This means that a good focusing of laser beam 18 is obtained in the focal plane and a strong divergence of laser beam 18 is obtained downstream of the focal plane.

As shown in FIG. 4, the illumination decreases by a factor of approximately 15 when the distance to the focal plane in silicon oxide layer 30 increases by 5 µm. In the focal plane, the diameter of the laser spot is approximately 1.7 µm and 5 µm after the focal plane in silicon dioxide, the diameter of the laser beam is approximately 6.5 µm. This further means that the fluence of the light beam at 5 µm after the focal plane in silicon dioxide is substantially equal to 7% of the fluence of the laser beam in the focal plane. Further, in the case where the region 28 to be treated corresponds to a layer interposed between substrate 22 and dielectric layer 30 of negligible thickness which has a transmission in the order of 40% in linear state. The transmission may be much lower in the case where the laser beam causes the local forming of a plasma in the region 18 to be treated. Further, considering the fact that 15% of the radiation is reflected at the level of the layer 28 to be treated towards silicon substrate 22, it is obtained that the fluence of the laser beam at 5 µm after the focal plane in silicon dioxide is substantially equal to 2.4% of the fluence of laser beam 18 in the focal plane. This means that possible components formed on top of/inside of layer 30 may not be impacted by the treatment performed by treatment system 40.

Various embodiments and variants have been described. Those skilled in the art will understand that certain features of these various embodiments and variants may be combined, and other variants will occur to those skilled in the art. Finally, the practical implementation of the described embodiments and variants is within the abilities of those skilled in the art based on the functional indications given hereabove.

The invention claimed is:

1. System comprising:
an object comprising a substrate, a region to be treated adjacent to the substrate, and an element to be detached adjacent to the region and opposite to the substrate;
a source of an incident laser beam configured to deliver a focused laser beam, said system being configured so that the wavelength of the incident laser beam is greater than the sum of 500 nm and of the wavelength associated with the bandgap of the material forming the substrate and smaller than the sum of 2,500 nm and of the wavelength associated with the bandgap of the material forming the substrate; and
an optical device associating a digital aperture greater than 0.3 and means for correcting the spherical aberrations appearing during the crossing of the substrate for a given thickness of the substrate and a given distance between the substrate and the optical device,
said treatment being performed on said region adjacent to the substrate and opposite to the optical device, that is, through the whole substrate, and comprising the physical, chemical, or physico-chemical modification or the ablation of said region which results in the detachment of the element,
and wherein said source is adapted to delivering at least one pulse of the incident laser beam, the duration of said at least one pulse being in the range from 0.1 ps and 1000 ps.

2. System according to claim 1, wherein the material forming the substrate is semiconductor.

3. System according to claim 1, wherein the source is adapted to delivering said at least one pulse of the incident laser beam with a peak power in the range from 300 kW to 100 MW.

4. System according to claim 1, wherein the optical device comprises at least one aspherical lens.

5. Method for treating a region of an object further comprising a substrate adjacent to the region to be treated comprising exposing the region to be treated to the focused laser beam delivered by the system according to claim 1 through the substrate.

6. Method according to claim 5, wherein the substrate is semiconductor.

7. Method according to claim 5, comprising the delivery of said at least one pulse of the incident laser beam, the duration of said at least one pulse being in the range from 0.1 ps to 1,000 ps.

8. Method according to claim 7, comprising the delivery of said at least one pulse with a peak power in the range from 300 kW to 100 MW.

9. Method according to claim 5, wherein the substrate comprises a surface oriented towards the system, the method comprising the forming of an antireflection layer on said surface.

10. Method according to claim 5, wherein the substrate is made of silicon, of germanium, or of a mixture or alloy of at least two of these compounds.

11. Method according to claim 5, wherein the object comprises a dielectric layer covering the substrate, the region to the treated being interposed between the substrate and the dielectric layer.

12. Method according to claim 5, wherein the object comprises at least one electronic circuit covering the substrate, the region to be treated being interposed between the substrate and the electronic circuit.

13. Method according to claim 5, comprising the destruction of the region of interest by the focused laser beam.

\* \* \* \* \*